United States Patent
Oh

(10) Patent No.: US 9,158,338 B2
(45) Date of Patent: Oct. 13, 2015

(54) INTEGRATED CIRCUIT CHIP, MOBILE DEVICE INCLUDING THE SAME, AND METHOD FOR OPERATING THE MOBILE DEVICE WITH IMPROVED IMPEDANCE MATCHING FUNCTION CONTROL

(71) Applicant: SK hynix Inc., Gyeonggi-do (KR)

(72) Inventor: Seung-Min Oh, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 421 days.

(21) Appl. No.: 13/716,462

(22) Filed: Dec. 17, 2012

(65) Prior Publication Data

US 2013/0215569 A1    Aug. 22, 2013

(30) Foreign Application Priority Data

Feb. 20, 2012  (KR) .................. 10-2012-0016744

(51) Int. Cl.
*G06F 1/16*     (2006.01)
*H01L 25/00*    (2006.01)
*H02J 7/00*     (2006.01)

(52) U.S. Cl.
CPC ............. *G06F 1/1632* (2013.01); *H01L 25/00* (2013.01); *H02J 7/0054* (2013.01); *H01L 2924/0002* (2013.01); *H02J 2007/0095* (2013.01)

(58) Field of Classification Search
CPC .. G06F 13/4086; G06F 1/1632; H02J 7/0047; H02J 7/0052; H02J 7/0054; H02J 2007/0062; H02J 7/0068; H02J 2007/0095
USPC ............... 710/303; 320/114, 115; 326/30
See application file for complete search history.

(56) References Cited

U.S. PATENT DOCUMENTS

| 5,884,049 A | 3/1999 | Atkinson |
| 6,711,639 B1* | 3/2004 | Singer et al. .................. 710/100 |
| 2004/0150944 A1* | 8/2004 | Byrne et al. .................. 361/683 |
| 2007/0101039 A1* | 5/2007 | Rutledge et al. ............. 710/303 |
| 2010/0120456 A1* | 5/2010 | Karmarkar et al. ........... 455/466 |

FOREIGN PATENT DOCUMENTS

KR      1020110111828      10/2011

* cited by examiner

*Primary Examiner* — Glenn A Auve
(74) *Attorney, Agent, or Firm* — IP & T Group LLP

(57) ABSTRACT

A mobile device includes a docking unit for docking with an external device, and an integrated circuit chip including an impedance matching circuit for impedance matching of an internal bus outside of the integrated circuit chip, wherein activation or deactivation of the impedance matching circuit is determined based on whether the docking unit is docked.

13 Claims, 5 Drawing Sheets

INTEGRATED CIRCUIT CHIP, MOBILE DEVICE INCLUDING THE SAME, AND METHOD FOR OPERATING THE MOBILE DEVICE WITH IMPROVED IMPEDANCE MATCHING FUNCTION CONTROL

CROSS-REFERENCE TO RELATED APPLICATIONS

The present application claims priority of Korean Patent Application No. 10-2012-0016744, filed on Feb. 20, 2012, which is incorporated herein by reference in its entirety.

BACKGROUND

1. Field

Exemplary embodiments of the present invention relate to an integrated circuit chip and a mobile device including the same, and more particularly, to a technology for efficiently using an impedance matching function.

2. Description of the Related Art

Various integrated circuit chips such as CPUs, memories, or gate arrays are embedded in various electrical products such as personal computers, servers, or mobile phones. In most cases, the integrated circuit chip has a receiver for receiving various signals, which are transmitted from an outside, through an input pad, and a transmitter for transmitting internal signals externally through an output pad.

Meanwhile, as an electrical product operates at a high speed, an impedance matching between integrated circuit chips becomes very important. When an impedance mismatching occurs, signals transferred at a high speed between the chips may be reflected, and thus a certain receiver may not normally recognize the signals.

FIG. 1 is a diagram illustrating an impedance matching circuit used in a conventional integrated circuit chip.

Referring to FIG. 1, the integrated circuit chip includes a pull-up resistor 101 and a pull-down resistor 102, a pull-up switch SW1 and a pull-down switch SW2. The integrated circuit chip performs an impedance matching operation of an input/output pad I/O PAD by terminating the input/output pad I/O PAD in pull-up and pull-down directions. An on/off signal ON/OFF, applied to the pull-up and pull-down switches SW1 and SW2, is for turning on/off the impedance matching circuit.

When the impedance matching circuit is turned on, impedance of a transmission channel connected to the input/output pad I/O PAD is matched, so that a signal can be stably input and output. When the impedance matching circuit is turned on, a current path is formed from a power supply voltage terminal VDD to a ground terminal VSS through the pull-up resistor 101 and the pull-down resistor 102. Although the use of the impedance matching circuit guarantees stable signal transmission, simultaneously causes high current consumption. Due to the high current consumption in the impedance matching circuit, an integrated circuit chip in most devices driven by a battery does not use the impedance matching circuit. For example, although the impedance matching circuit is provided in a memory chip used in a mobile device, the impedance matching circuit is generally deactivated.

SUMMARY

Exemplary embodiments of the present invention are directed to a technology for efficiently using an impedance matching circuit in an integrated circuit chip embedded in a mobile device.

In accordance with an embodiment of the present invention, a mobile device includes a docking unit for docking with an external device, and an integrated circuit chip including an impedance matching circuit for impedance matching of an internal bus outside of the integrated circuit chip, wherein the activation or deactivation of the impedance matching circuit is determined based on whether the docking unit is docked.

In accordance with another embodiment of the present invention, a mobile device includes a battery, a power socket configured to receive external power, a power switch unit configured to provide power of the battery or external power supplied to the power socket as internal power, and an integrated circuit chip including an impedance matching circuit for impedance matching of an internal bus outside of the integrated circuit chip, wherein the activation or deactivation of the impedance matching circuit is determined based on a power source of the internal power provided by the power switch unit.

In accordance with another embodiment of the present invention, an integrated circuit chip includes a pad; an impedance matching circuit configured to perform an impedance matching operation by terminating the pad in response to an on/off signal, and an impedance matching control circuit configured to generate the on/off signal and to be activated or deactivated based on whether a system including the integrated circuit chip is docked using a signal applied from the system.

In accordance with another embodiment of the present invention, an integrated circuit chip includes a pad, an impedance matching circuit configured to perform an impedance matching operation by terminating the pad in response to an on/off signal, and an impedance matching control circuit configured to generate the on/off signal and to be activated or deactivated based on whether system battery power is used.

In accordance with another embodiment of the present invention, a method for operating a mobile device includes checking a docking state of the mobile device and an external device, and activating an impedance matching function for an internal bus in response to the checked docking state.

In accordance with another embodiment of the present invention, a method for operating a mobile device includes checking a supplying state of external power, and activating an impedance matching function for an internal bus in response to the checked supplying state.

In accordance with another embodiment of the present invention, a mobile computer includes a docking unit for docking with an external device, a plurality of chips including a microprocessor chip and a main memory chip, and an internal bus for signal transmission among the plurality of chips, wherein one or more of the plurality of chips include an impedance matching circuit for impedance matching of the internal bus, and the activation or deactivation of the impedance matching circuit is determined based on whether the docking unit is docked.

In accordance with another embodiment of the present invention, a mobile computer includes, a battery, a power socket configured to receive external power, a power switch unit configured to provide power of the battery or external power supplied to the socket, as internal power, a plurality of chips including a microprocessor chip and a main memory chip, and an internal bus for signal transmission among the plurality of chips, wherein one or more of the plurality of chips include an impedance matching circuit for impedance matching of the internal bus, and the activation or deactivation of the impedance matching circuit is determined based on a power source of the internal power provided by the power switch unit.

In accordance with another embodiment of the present invention, a mobile terminal includes a battery, a docking unit for docking with an external device, a power switch unit configured to provide power supplied from an external source as internal power when the docking unit is docked, or to provide power of the battery as internal power when the docking unit is not docked, a display unit, an input unit, a communication unit, a control unit configured to control the docking unit, the power switch unit, the display unit, the input unit, and the communication unit, and a memory unit including an impedance matching circuit configured to be interfaced with the control unit through an internal bus, to perform impedance matching of the internal bus, and to be activated or deactivated based on whether the docking unit is docked.

According to the embodiments of present invention, when a mobile device is docked with an external device or external power source is applied to the mobile device, an impedance matching circuit is activated. Consequently, the impedance matching circuit may be efficiently used according to situations.

DETAILED DESCRIPTION

Figure 1:
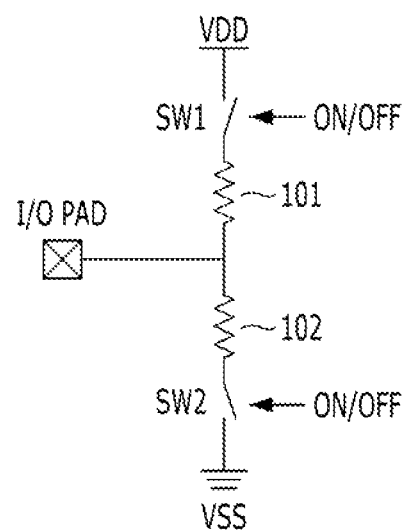
FIG. 1 is a diagram illustrating an impedance matching circuit used in a conventional integrated circuit chip.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. In this specification, a singular form may include a plural form as long as it is not specifically mentioned in a sentence.

According to the embodiments of the present invention, an impedance matching function of an integrated circuit chip in a mobile device is activated or deactivated according to whether a mobile device such as a mobile PDA or a mobile terminal has been docked with an external device, or power is supplied from an external source.

Figure 2:
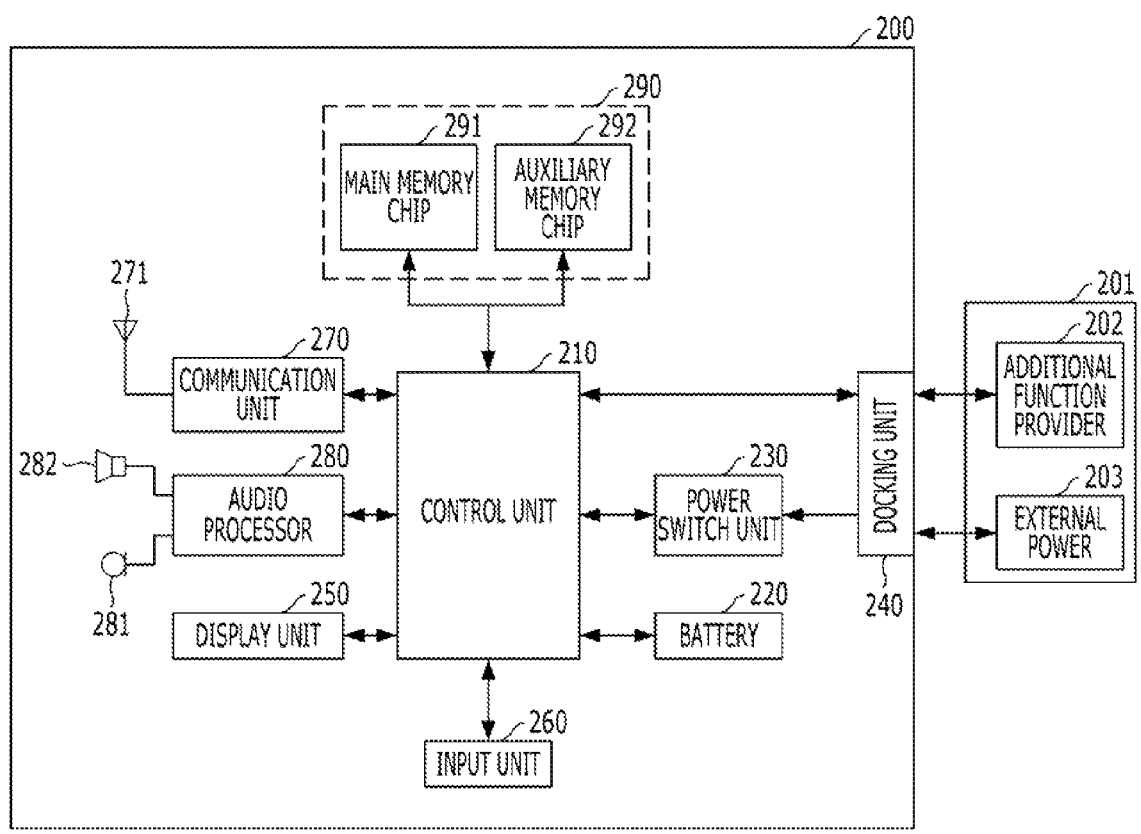
FIG. 2 is a diagram illustrating a mobile terminal and a docking station in accordance with an embodiment of the present invention.

FIG. 2 is a diagram illustrating a mobile terminal 200 and a docking station 201 in accordance with an embodiment of the present invention.

Referring to FIG. 2, the mobile terminal 200 includes a control unit 210, a battery 220, a power switch unit 230, a docking unit 240, a display unit 250, an input unit 260, a communication unit 270, an audio processor 280, and a memory unit 290.

The control unit 210 is configured to control a general operation of the mobile terminal 200. In accordance with the embodiment of the present invention, the control unit 210 performs a function of receiving information regarding whether the mobile terminal 200 has been docked with the docking station 201 from the docking unit 240, and transferring the information to each element of the mobile terminal 200.

The display unit 250 is configured to provide visual information to users using a mobile terminal. The display unit 250 may include an LCD, an LED or the like. The input unit 260 is an element for an interface with a user, and may include a keypad including a plurality of buttons. Recently, there are many cases in which input is received from a user through a touchscreen. In these cases, the display unit 250 and the input unit 260 may be integrally formed with each other. The communication unit 270 is configured to transmit/receive various pieces of data such as audio data, video data, or control data through an antenna 271 in a wireless manner. The audio processor 280 is configured to process audio data and input/output audio through a microphone 281 and a speaker 282. The memory unit 290 includes a main memory chip 291 and an auxiliary memory chip 292. The main memory chip generally uses a DRAM and the auxiliary memory chip generally uses a FLASH memory.

The docking unit 240 is an element for docking with the docking station 201, which is located outside of the mobile terminal 200. The docking station 201 provides the docked mobile terminal 200 with an additional function 202 and external power 203. The additional function 202 provided from the docking station 201 to the mobile terminal may include high processing power, a more convenient input device (a keyboard), a more large display, a wired LAN and the like. The power switch unit 230 is configured to provide power of the battery 220 as internal power to be used in the mobile terminal 200, or to supply the external power 203 provided through the docking unit 240 as the internal power to be used in the mobile terminal 200.

Each of the elements 210, 240, 250, 260, 270, 280, and 290 of the mobile terminal 200 includes at least one integrated circuit, chip, and these chips exchange signals with other chips through internal buses. Thus, some of the chips include an impedance matching circuit for impedance matching. Particularly, the control unit 210 and the main memory chip 291, which exchange a signal (data) at a high speed, may include the impedance matching circuit. The impedance matching circuit in the integrated circuit chips is activated or deactivated according to whether the docking unit 240 has been docked. At the time of activation of the impedance matching circuit, the impedance matching circuit is turned on/off according to data transmission states. For example, when data is received in the integrated circuit chips, the impedance matching circuit is turned on. In other cases, the impedance matching circuit is turned off. At the time of deactivation of the impedance matching circuit, the impedance matching circuit substantially maintains a turn off state at all times regardless of the data transmission states.

According to the embodiment of the present invention, when the mobile terminal is docked with an external device, the impedance matching circuit in the integrated circuit chips in the mobile terminal is activated, so that stable data transmission is performed. When the mobile terminal is not docked with an external device, the impedance matching circuit of the integrated circuit chips is deactivated, so that current consumption is reduced. Consequently, in a docking state in which a high speed operation is generally required, stabilization of data transmission is performed, and in an undocking state in which reduction of battery current consumption is required more than a high speed operation, a low power operation is performed.

Figure 3:
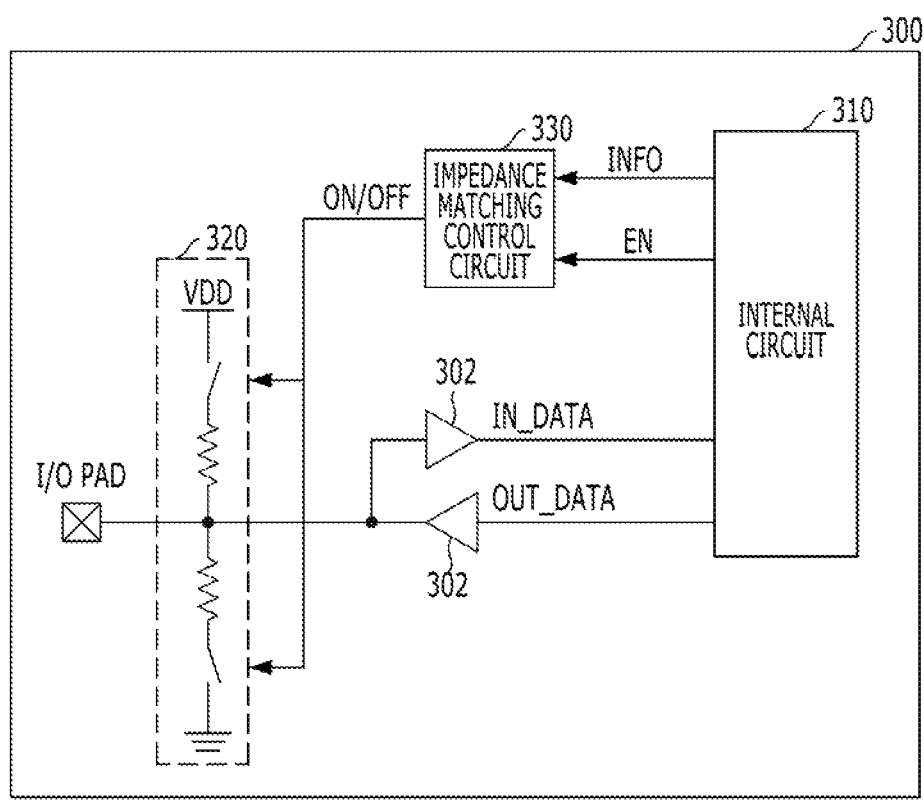
FIG. 3 is a configuration diagram of an integrated circuit chip in accordance with another embodiment of the present invention.

FIG. 3 is a configuration diagram of an integrated circuit chip 300 in accordance with another embodiment of the present invention.

The integrated circuit chip 300 illustrated in FIG. 3 may be an element including the integrated circuit chip among the elements in the mobile terminal 200 shown in FIG. 2. Referring to FIG. 3, the integrated circuit chip 300 includes an internal circuit 310, an input/output pad I/O PAD, an output circuit 301, an input circuit 302, an impedance matching circuit 320, and an impedance matching control circuit 330.

The internal circuit 310 is configured to perform a function unique to the integrated circuit chip 300. When the integrated circuit chip 300 is the main memory chip 291, the internal circuit may be a circuit for storing data and a circuit for controlling the same. When the integrated circuit chip 300 is the control unit 210, the internal circuit 310 may be a circuit for generally controlling the mobile terminal 200 and performing various operations.

The output circuit 301 is configured to output data OUT_DATA, which is to be output externally from the integrated circuit chip 300, through the input/output pad I/O PAD. The input circuit 302 is configured to receive data, which is input from the outside of the integrated circuit chip 300 through the input/output pad I/O PAD, and to transfer the data to the internal circuit 310. FIG. 3 illustrates only one input/output pad I/O PAD, one output circuit 301, and one input circuit 302. However, this is for illustrative purposes only, and the integrated circuit chip 300 may include a plurality of input/output pads I/O PAD, a plurality of input output circuits 301, and a plurality of input circuits 302.

The impedance matching circuit 320 includes a pull-up resistor 321 and a pull-down resistor 322, and performs an impedance matching operation of the input/output pad I/O PAD by terminating the input/output pad I/O PAD in pull-up and pull-down directions. The impedance matching circuit 320 is turned on/off by an on/off signal ON/OFF, wherein the on/off signal ON/OFF is generated by the impedance matching control circuit 330. FIG. 3 illustrates the impedance matching circuit 320 separately from the output circuit 301. However, the impedance matching circuit 320 may be integrated with the output circuit 301 according to a design. Furthermore, when a plurality of input/output pads I/O PADS are provided, a plurality of impedance matching circuits 320 may be provided.

The impedance matching control circuit 330 is configured to be activated or deactivated according to whether the mobile terminal 200 has been docked. Information regarding whether the mobile terminal 200 has been docked is transferred to the internal circuit 310 through the input/output pad I/O PAD, and the internal circuit 310 activates or deactivates the impedance matching control circuit 330 through an activation signal EN. In detail, when the mobile terminal 200 is docked, the internal circuit 310 activates the activation signal EN to operate the impedance matching control circuit 330. When the mobile terminal 200 is not docked, the internal circuit 310 deactivates the activation signal EN to deactivate the impedance matching control circuit 330.

At the time of the activation, the impedance matching control circuit 330 turns on the impedance matching circuit 320 in a period in which impedance matching is required, but turns off the impedance matching circuit 320 in a period in which the impedance matching is not required. In general, since a reception terminal performs an impedance matching operation for a transmission channel, the impedance matching control circuit 330 turns on the impedance matching circuit in a period in which data is input through the in input/output pad I/O PAD. The impedance matching control circuit 330 understands the current state of the input/output pad I/O PAD through information INFO transferred from the internal circuit 310.

At the time of the deactivation, the impedance matching control circuit 330 substantially maintains the impedance matching circuit 320 in a turn off state through the on/off signal ON/OFF.

That is, according to an embodiment of the mobile terminal 200, when the mobile terminal 200 including the integrated circuit chip 300 is docked, the impedance matching function of the integrated circuit chip 300 is activated, and when the mobile terminal 200 is not docked, the impedance matching function of the integrated circuit chip 300 is deactivated.

Figure 4:
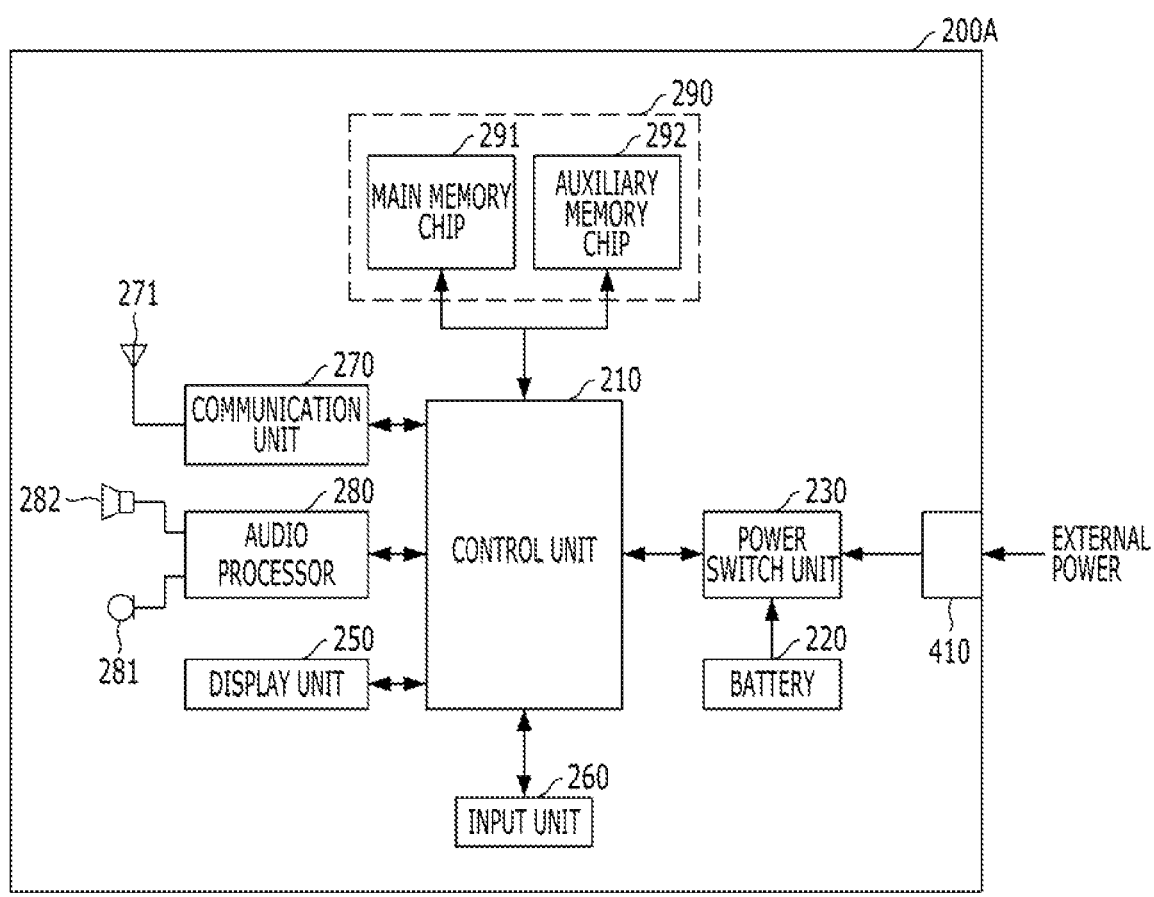
FIG. 4 is a diagram illustrating a mobile terminal in accordance with another embodiment of the present invention.

FIG. 4 is a diagram illustrating the mobile terminal 200A in accordance with another embodiment of the present invention.

The mobile terminal 200A in accordance with the embodiment of the present invention does not have the docking unit 240 shown in FIG. 2, and it instead has a power socket 410 for receiving external power. When the external power is supplied, the power switch unit 230 informs the control unit 210 of the supply of the external power, and the control unit 210 transfers information, which indicates that the external power is currently supplied, to each element of the mobile terminal 200A. Impedance matching functions of various integrated circuit chips in the mobile terminal 200A are activated or deactivated according to whether the external power is supplied.

That is, according to another embodiment of the mobile terminal 200A, when the mobile terminal 200A operates with external power supplied from the power socket 410, the impedance matching functions of the integrated circuit chips in the mobile terminal 200 are activated, and when the mobile terminal 200A operates with power of the battery 220, the impedance matching functions of the integrated circuit chips are deactivated.

The activation or deactivation of the impedance matching functions of the integrated circuit chips in the mobile terminal 200A according to whether the external power has been applied may be performed in the same manner as that described in FIG. 3 by replacing information regarding whether the mobile terminal 200 has been docked with information regarding whether the external power has been supplied.

Figure 5:
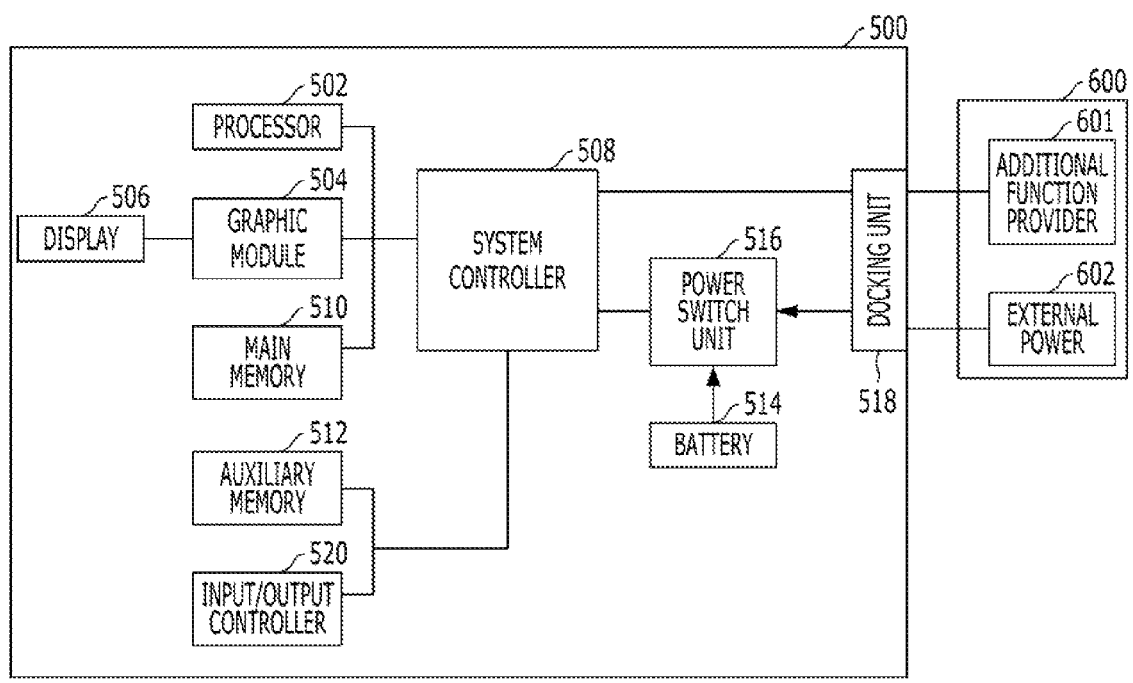
FIG. 5 is diagram illustrating a mobile computer and a docking station in accordance with another embodiment of the present invention.

FIG. 5 is diagram illustrating a mobile computer 500 and a docking station 600 in accordance with another embodiment of the present invention.

Referring to FIG. 5, the mobile computer 500 includes a processor 502, a graphic module 504, a display 506, a system controller 508, a main memory 510, an auxiliary memory 512, a battery 514, a power switch unit 516, a docking unit 518, and an input/output controller 520.

The system controller 508 is configured to control an entire system of the mobile computer 500. Such a system controller 508 is also called a chipset, and may include a plurality of chips (for example, a north bridge and a south bridge). In accordance with the embodiment of the present invention, the system controller 508 is configured to receive information regarding whether the mobile computer 500 has been docked with the docking station 600 from the docking unit 518, and transferring the information to each element of the mobile computer 500. The processor 502 is configured to perform main operations of the mobile computer 500, and is also well-known as a CPU. The graphic module 504 is configured to process graphic data of the mobile computer 500, and the display 506 is configured to provide a user with the graphic data processed by the graphic module. The main memory 510 is configured to temporarily store working data of the processor, and generally uses a DRAM. The auxiliary memory 512 is configured to store an OS and various applications used by the mobile computer 500, and may use a solid state drive (SSD) or a hard disk drive including a FLASH memory. The input/output controller 520 is configured to connect the mobile computer 500 to an external peripheral device. For example, the input/output controller may include a USB controller.

The docking unit 518 is an element required when the mobile computer 500 is docked with the docking station 600. The docking station 600 provides the docked mobile computer 500 with an additional function 601 and external power 602. The additional function 601 provided from the docking station 600 to the mobile computer 500 may include high-speed processing or graphic processing capability, a high capacity of auxiliary memory and the like. The power switch unit 516 is configured to provide power of the battery 514 as internal power to be used in the mobile computer 500, or to provide the external power provided through the docking unit 518 as the internal power to be used in the mobile computer 500.

Each of the elements 502, 504, 508, 510, 512, and 520 of the mobile computer 500 includes at least one integrated circuit chip, and these chips exchange signals with other chips through internal buses. Thus, some of the chips may include an impedance matching circuit for impedance matching. Particularly, a processor chip, a system controller chip, and a main memory chip, which exchange a signal (data) at a high speed, may include the impedance matching circuit. The impedance matching circuit in the integrated circuit chips is activated or deactivated according to whether the docking unit 518 has been docked. At the time of activation of the impedance matching circuit, the impedance matching circuit is turned on/off according to data transmission states. For example, when data is received in the integrated circuit chips, the impedance matching circuit is turned on. In other cases, the impedance matching circuit is turned off. At the time of deactivation of the impedance matching circuit, the impedance matching circuit substantially maintains a turn off state at all times regardless of the data transmission states.

Furthermore, the impedance matching circuit in the integrated circuit chips in the mobile computer may be activated or deactivated according to whether the mobile computer 500 operates with the external power 602 or the power of the battery 514.

That is, according to the embodiments of the present invention, the impedance matching function of the integrated circuit chips in the mobile computer may be activated or deactivated (1) according to whether the mobile computer is docked or (2) according to whether external power is applied to the mobile computer.

While the present invention has been described with respect to the specific embodiments, it will be apparent to those skilled in the art that various changes and modifications may be made without departing from the spirit and scope of the invention as defined in the following claims.

Particularly, in the aforementioned embodiments, the present invention has been described by employing the mobile terminal and the mobile computer as an example. However, the present invention is applicable to all kinds of mobile devices as well as the mobile terminal and the mobile computer.

What is claimed is:

1. A mobile device comprising:
a docking unit for docking with an external device; and
an integrated circuit chip including an impedance matching circuit for impedance matching of an internal bus outside of the integrated circuit chip,
wherein activation or deactivation of the impedance matching circuit is determined based on whether the docking unit is docked,
wherein, when the impedance matching circuit is activated, the impedance matching circuit is turned on/off under a control of the integrated circuit chip including the impedance matching circuit, and when the impedance matching circuit is deactivated, the impedance matching circuit substantially maintains a turn off state.

2. A mobile device comprising:
a battery;
a power socket configured to receive external power;
a power switch unit configured to provide power of the battery or external power supplied to the power socket as internal power; and
an integrated circuit chip including an impedance matching circuit for impedance matching of an internal bus outside of the integrated circuit chip,
wherein activation or deactivation of the impedance matching circuit is determined based on a power source of the internal power provided by the power switch unit.

3. The mobile device of claim 2, wherein, when the impedance matching circuit is activated, the impedance matching circuit is turned on/off under control of the integrated circuit chip including the impedance matching circuit, and when the impedance matching circuit is deactivated, the impedance matching circuit substantially maintains a turn off state.

4. An integrated circuit chip comprising:
a pad;
an impedance matching circuit configured to perform an impedance matching operation by terminating the pad in response to an on/off signal; and
an impedance matching control circuit configured to generate the on/off signal and to be activated or deactivated based on whether a system including the integrated circuit chip is docked using a signal applied from the system.

5. The integrated circuit chip of claim 4, wherein the impedance matching control circuit is configured to substantially maintain the on/off signal in an off state when the impedance matching control circuit is deactivated.

6. The integrated circuit chip of claim 4, wherein the pad includes a data input/output pad.

7. An integrated circuit chip comprising:
a pad;
an impedance matching circuit configured to perform an impedance matching operation by terminating the pad in response to an on/off signal; and
an impedance matching control circuit configured to generate the on/off signal and to be activated or deactivated based on whether system battery power is used.

8. The integrated circuit chip of claim 7, wherein the impedance matching control circuit is configured to be activated when external power supplied to a system including the integrated circuit chip is used.

9. The integrated circuit chip of claim 7, wherein the pad includes a data input/output pad.

10. A method for operating a mobile device, comprising:
checking a supplying state of external power; and
activating an impedance matching function for an internal bus in response to the checked supplying state.

11. A mobile computer comprising:
a docking unit for docking with an external device;
a plurality of chips including a microprocessor chip and a main memory chip; and
an internal bus for signal transmission among the plurality of chips,
wherein one or more of the plurality of chips include an impedance matching circuit for impedance matching of the internal bus, and activation or deactivation of the impedance matching circuit is determined based on whether the docking unit is docked, and
wherein, when the impedance matching circuit is activated, the impedance matching circuit is turned on/off under a control of said one or more of the plurality chips including the impedance matching circuit, and when the impedance matching circuit is deactivated, the impedance matching circuit substantially maintains a turn off state.

12. A mobile computer comprising:
a battery;
a power socket configured to receive external power;
a power switch unit configured to provide power of the battery or external power supplied to the socket, as internal power;
a plurality of chips including a microprocessor chip and a main memory chip; and
an internal bus for signal transmission among the plurality of chips,
wherein one or more of the plurality of chips include an impedance matching circuit for impedance matching of the internal bus, and activation or deactivation of the impedance matching circuit is determined based on a power source of the internal power provided by the power switch unit.

13. A mobile terminal comprising:
a battery;
a docking unit for docking with an external device;
a power switch unit configured to provide power supplied from an external source as internal power when the docking unit is docked, or to provide power of the battery as internal power when the docking unit is not docked;
a display unit;
an input unit;
a communication unit;
a control unit configured to control the docking unit, the power switch unit, the display unit, the input unit, and the communication unit; and
a memory unit including an impedance matching circuit configured to be interfaced with the control unit through an internal bus, to perform impedance matching of the internal bus, and to be activated or deactivated based on whether the docking unit is docked,
wherein, when the impedance matching circuit is activated, the impedance matching circuit is turned on/off under a control of the memory unit, and when the impedance matching circuit is deactivated, the impedance matching circuit substantially maintains a turn off state.

* * * * *